(12) United States Patent
Yang et al.

(10) Patent No.: US 7,932,581 B2
(45) Date of Patent: Apr. 26, 2011

(54) LATERAL BIPOLAR JUNCTION TRANSISTOR

(75) Inventors: Ming-Tzong Yang, Hsinchu County (TW); Ching-Chung Ko, Hsinchu County (TW); Tung-Hsing Lee, Taipei County (TW); Zheng Zeng, Fremont, CA (US)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 50 days.

(21) Appl. No.: 12/464,107

(22) Filed: May 12, 2009

(65) Prior Publication Data

US 2010/0289058 A1 Nov. 18, 2010

(51) Int. Cl.
*H01L 29/66* (2006.01)

(52) U.S. Cl. .................. 257/565; 257/E29.187; 438/204

(58) Field of Classification Search .................. 257/565, 257/575, 370, E29.187; 438/204, 335
See application file for complete search history.

(56) References Cited

U.S. PATENT DOCUMENTS

| 5,139,961 A | 8/1992 | Solheim et al. |
| 5,717,241 A | 2/1998 | Malhi |
| 2010/0252860 A1* | 10/2010 | Yang et al. ..................... 257/133 |

* cited by examiner

*Primary Examiner* — Mark Prenty
(74) *Attorney, Agent, or Firm* — Winston Hsu; Scott Margo

(57) ABSTRACT

A lateral bipolar junction transistor includes an emitter region; a base region surrounding the emitter region; a gate disposed at least over a portion of the base region; a collector region surrounding the base region with an offset between an edge of the gate and the collector region; a lightly doped drain region between the edge of the gate and the collector region; a salicide block layer disposed on or over the lightly doped drain region; and a collector salicide formed on at least a portion of the collector region.

22 Claims, 15 Drawing Sheets

LATERAL BIPOLAR JUNCTION TRANSISTOR

BACKGROUND OF THE INVENTION

1. Field of the Invention

The invention relates to the field of semiconductor technology and, more particularly, to a CMOS-based lateral bipolar junction transistor (LBJT) with high $BV_{CEO}$.

2. Description of the Prior Art

Bipolar junction transistors or bipolar transistors, which are formed using a CMOS compatible process, are well known in the art. These bipolar transistors are also referred to as lateral bipolar junction transistors and have high threshold frequency (Ft) and high beta.

In the design of semiconductor integrated circuits, it is often desirable to provide a mixed mode device, i.e., which has both BJT and CMOS functions. Mixed mode devices both increase the flexibility of the IC design and increase the performance of the IC. The integration of CMOS transistors with bipolar transistors to provide Bipolar-CMOS (BiCMOS) integrated circuits is now well established. BiCMOS circuits provide advantages such as high speed, high drive, mixed voltage performance with analog-digital capabilities, which are beneficial in applications such as telecommunications. However, there is considerable challenge in optimizing the performance of both CMOS and bipolar devices fabricated with progressively reduced dimensions. In order to fabricate an integrated circuit combining both bipolar transistors and field effect transistors on the same chip, compromises must be made during both design and fabrication to optimize performance of both bipolar and field effect transistors, without inordinately increasing the number of processing steps.

The lateral bipolar transistor is fabricated using a typical lightly doped drain (LDD) MOS transistor. An NPN device is formed from an NMOS transistor and a PNP device is formed from a PMOS transistor. The base width of the lateral bipolar transistor is determined by and is usually equal to the MOS channel length. It is desirable to have a CMOS-based bipolar transistor having improved bipolar performance and high $BV_{CEO}$.

SUMMARY OF THE INVENTION

It is one object of this invention to provide a CMOS-based lateral bipolar junction transistor (lateral BJT) with high $BV_{CEO}$ (Breakdown Voltage collector-emitter-open).

According to the claimed invention, a lateral bipolar junction transistor includes an emitter region; a base region surrounding the emitter region; a gate disposed at least over a portion of the base region; a collector region surrounding the base region with an offset between an edge of the gate and the collector region; a lightly doped drain region between the edge of the gate and the collector region; a salicide block layer disposed on or over the lightly doped drain region; and a collector salicide formed on at least a portion of the collector region.

In one aspect, a lateral bipolar junction transistor includes an emitter region; a base region surrounding the emitter region; a gate disposed at least over a portion of the base region; a collector region surrounding the base region with an offset between an edge of the gate and the collector region; a lightly doped drain region between the edge of the gate and the collector region; and a collector salicide formed on at least a portion of the collector region; wherein no salicide is formed on or over the lightly doped drain region.

In another aspect, there is provided a method for fabricating a lateral bipolar junction transistor including providing a substrate having thereon an annular gate, a trench isolation region disposed about the gate, and lightly doped drain (LDD) region between the annular gate and the trench isolation region; ion implanting the substrate to form an emitter region surrounded by the annular gate and a collector region at one side of the annular gate opposite to the emitter region with an offset between an edge of the gate and the collector region; ion implanting the substrate to form an annular base contact region about the trench isolation region; forming an annular salicide block (SAB) layer to block at least a portion of the LDD region; and forming a salicide layer on the emitter region and on the collector region that is not covered by the SAB layer.

These and other objectives of the present invention will no doubt become obvious to those of ordinary skill in the art after reading the following detailed description of the preferred embodiment that is illustrated in the various figures and drawings.

DETAILED DESCRIPTION

The structure and layout of the present invention lateral bipolar junction transistor (LBJT) with higher $BV_{CEO}$ (Breakdown Voltage collector-emitter-open) are described in detail. The improved LBJT structure is described for a lateral PNP bipolar transistor, but it should be understood by those skilled in the art that by reversing the polarity of the conductive dopants lateral NPN bipolar transistors can be made.

Figure 1:
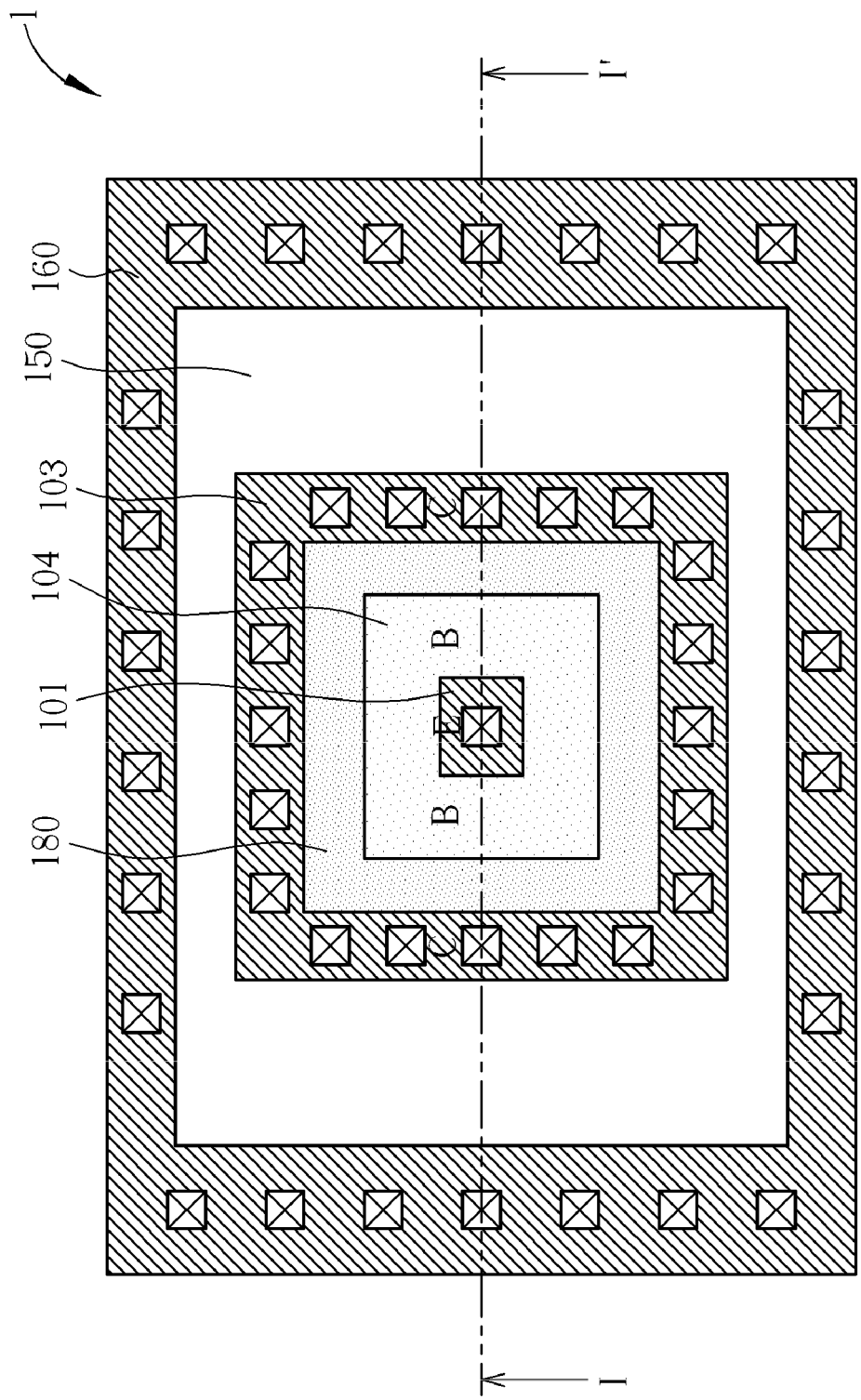
FIG. 1 is a top planar view of a layout of the lateral bipolar transistor according to one embodiment of the invention.
Figure 2:
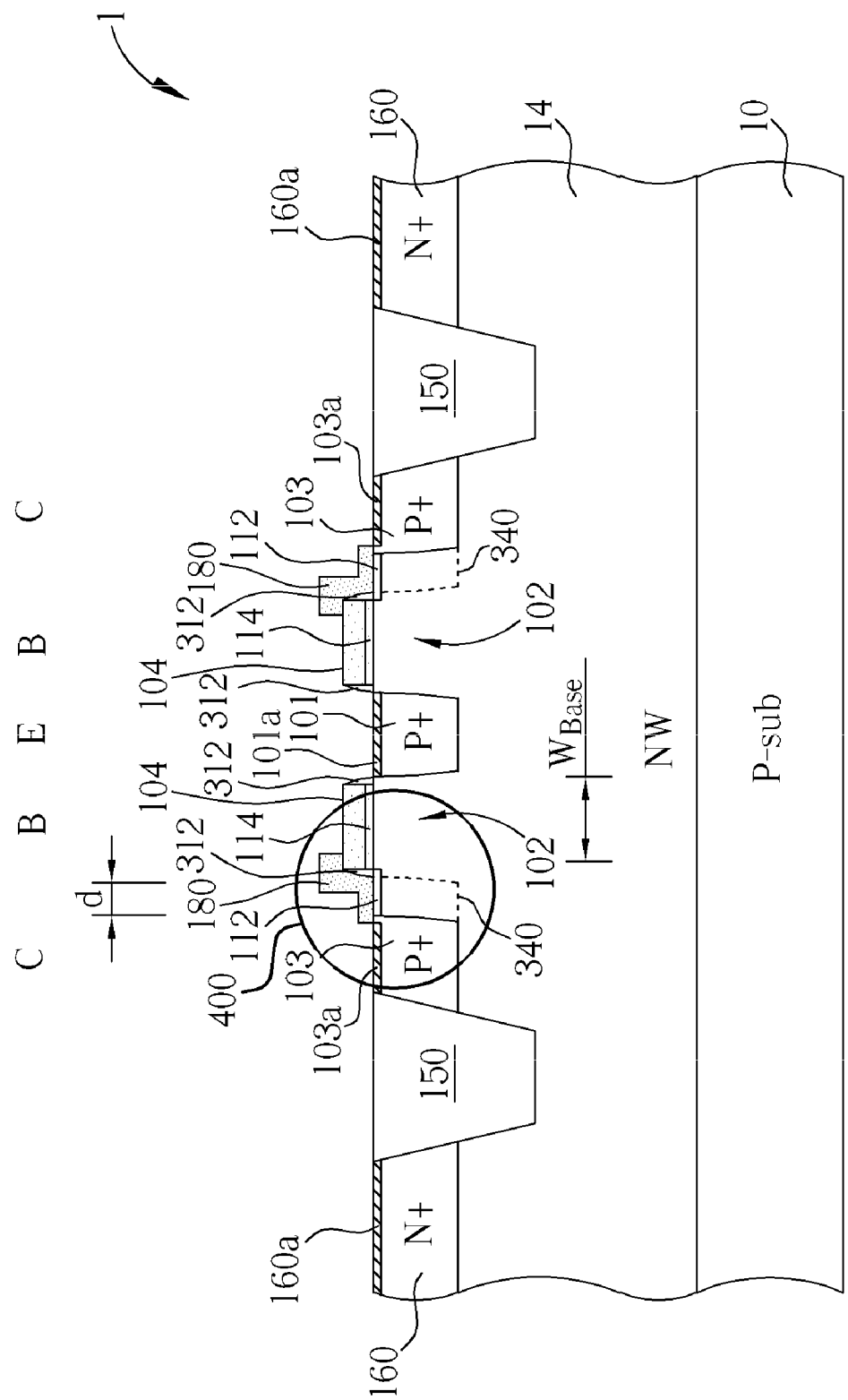
FIG. 2 is a schematic, cross-sectional view of the transistor in FIG. 1, taken along line I-I' of FIG. 1.

Please refer to FIG. 1 and FIG. 2. FIG. 1 is a top planar view of a layout of the lateral bipolar transistor according to one embodiment of the invention. FIG. 2 is a schematic, cross-sectional view of the transistor in FIG. 1, taken along line I-I' of FIG. 1. As shown in FIG. 1 and FIG. 2, the lateral PNP bipolar transistor 1 is formed in a semiconductor substrate 10 such as a P type doped silicon substrate. The lateral PNP bipolar transistor 1 comprises a $P^+$ doped region 101 that functions as an emitter region of the lateral PNP bipolar transistor 1, which is formed within an N well (NW) 14. The rectangular shape of the emitter region 101 as set forth in FIG.

1 is merely exemplary. It is understood that the emitter region 101 may have other polygonal shapes.

A base region 102 underlying an annular polysilicon gate 104 is disposed about a periphery of the emitter region 101. A voltage can be applied on the polysilicon gate 104 to change the characteristics of the lateral PNP bipolar transistor 1. It is understood that the rectangular shape of the polysilicon gate 104 as set forth in FIG. 1 is merely exemplary. The polysilicon gate 104 may have a polygonal shape corresponding to the shape of the emitter region 101. The base width ($W_{Base}$) is substantially equal to the gate length.

An annular $P^+$ doped region 103 that functions as a collector region of the lateral PNP bipolar transistor 1 is formed within the N well 14 and is disposed about a periphery of the base region 102. A shallow trench isolation (STI) region 150 is disposed about a periphery of the collector region 103. An annular $N^+$ base contact 160 is disposed about a periphery of the STI region 150.

In this embodiment, the N well 14, the emitter region 101, the collector region 103, the STI region 150, the $N^+$ base contact 160 and the polysilicon gate 104 are formed simultaneously with the formation of respective diffusion regions and gate structures of CMOS devices. The polysilicon gate 104 serves as an implant blockout mask during the formation of the emitter region 101 and the collector region 103.

As best seen in FIG. 2, a gate dielectric layer 114 is provided between the polysilicon gate 104 and the base region 102. In one embodiment, the gate dielectric layer 114 is formed simultaneously with the formation of gate oxide layer in CMOS devices for input/output (I/O) circuits. Accordingly, the gate dielectric layer 114 underlying the polysilicon gate 104 of the lateral PNP bipolar transistor 1 may have a thickness that is substantially equal to that of the gate oxide layer in CMOS devices for I/O circuits. By doing this, gate current (Ig) and GIDL (gate induced drain leakage) can be both reduced. On the two opposite sidewalls of the polysilicon gate 104, spacers may be provided.

Figure 11:
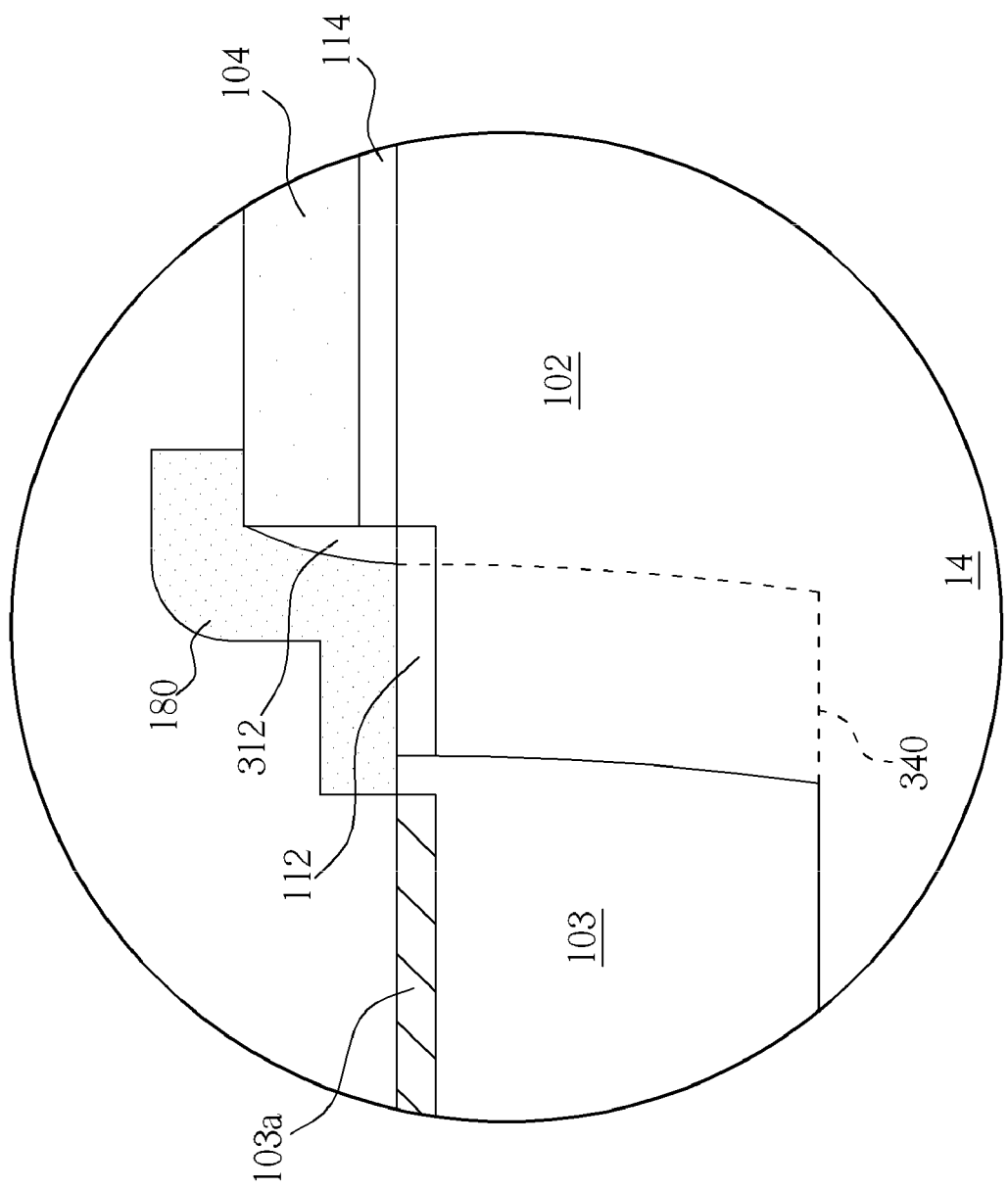
FIG. 11 is an enlarged view of the circular region as indicated in FIG. 2.

An enlarged view of the circular region 400 of FIG. 2 is illustrated in FIG. 11. It is one germane feature of the present invention that the collector region 103 may be pulled away from the edge of the spacer 312 of the polysilicon gate 104 in order to obtain a higher $BV_{CEO}$. To form such pull back collector region, a source/drain block layer may be employed to mask a portion of the active area or oxide defined (OD) area adjacent to the polysilicon gate 104 during the source/drain ion implant. The junction profile of the prior art LBJT is indicated by dashed line 340 to display the extent of the pulled back collector region 103. The edge of the collector region 103 is kept at a distance from the edge of the spacer 312 on the sidewall of the gate 104. In one aspect, the so-called "pull back" in this specification means that the distance between the edge of the collector region 103 and the edge of the spacer 312 is greater than the distance between the edge of the emitter region 101 and the edge of the spacer 312 near the emitter region 101.

It is another germane feature of the present invention that a P type lightly doped drain (PLDD) 112 may be situated between the collector region 103 and the polysilicon gate 104. The PLDD 112 may be disposed only on the side of the polysilicon gate 104 that is adjacent to the collector region 103, while on the other side adjacent to the emitter region 101, LDD may not be provided. In one aspect, the single sided PLDD 112 may be deemed a collector extension. In one embodiment, the PLDD 112 is formed simultaneously with the formation of LDD regions in CMOS devices. To form the single sided PLDD 112, a LDD block layer may be introduced into the fabrication process of the lateral PNP bipolar transistor 1. Further, a threshold voltage (Vt) implant block layer may be introduced into the fabrication process of the lateral PNP bipolar transistor 1 in order to create a lower doped base. The PLDD 112 may have a same doping concentration as a doping concentration of an I/O device, a doping concentration of a core device, or a sum thereof.

An annular salicide block (SAB) layer 180 is formed on or over the PLDD 112 and is disposed about a periphery of the polysilicon gate 104. The SAB layer 180 may extend up to the polysilicon gate 104. According to the embodiments of this invention, the SAB layer 180 may be composed of a dielectric material such as silicon oxide or silicon nitride. The SAB layer 180 also protects the PLDD 112, particularly the portion of the PLDD 112 between the edge of the collector region 103 and the edge of the spacer 312, from spike damage during the salicide process. After the formation of the SAB layer 180, an emitter salicide 101a may be formed on the emitter region 101. A collector salicide 103a may be formed on at least a portion of the collector region 103. A base salicide 160a may be formed on the $N^+$ base contact 160. In one embodiment, the offset d between the collector salicide 103a and the edge of the spacer 312 of the polysilicon gate 104 is not less than 0.1 μm.

The salicides 101a, 103a and 160a may be formed by depositing a metal over the substrate 10. Such metal reacts with the semiconductor material of the exposed regions to form the salicides, which provides low resistance contact to the emitter, the base and the collector of the lateral PNP bipolar transistor 1. The SAB layer 180 at the collector region 103, or say on or over the PLDD 112, prevents formation of salicide on or over the PLDD 112 or at the edge of the polysilicon gate 104. By providing the SAB layer 180 in the lateral PNP bipolar transistor 1, the leakage current due to salicide spike in the PLDD 112 is avoided.

Figure 3:
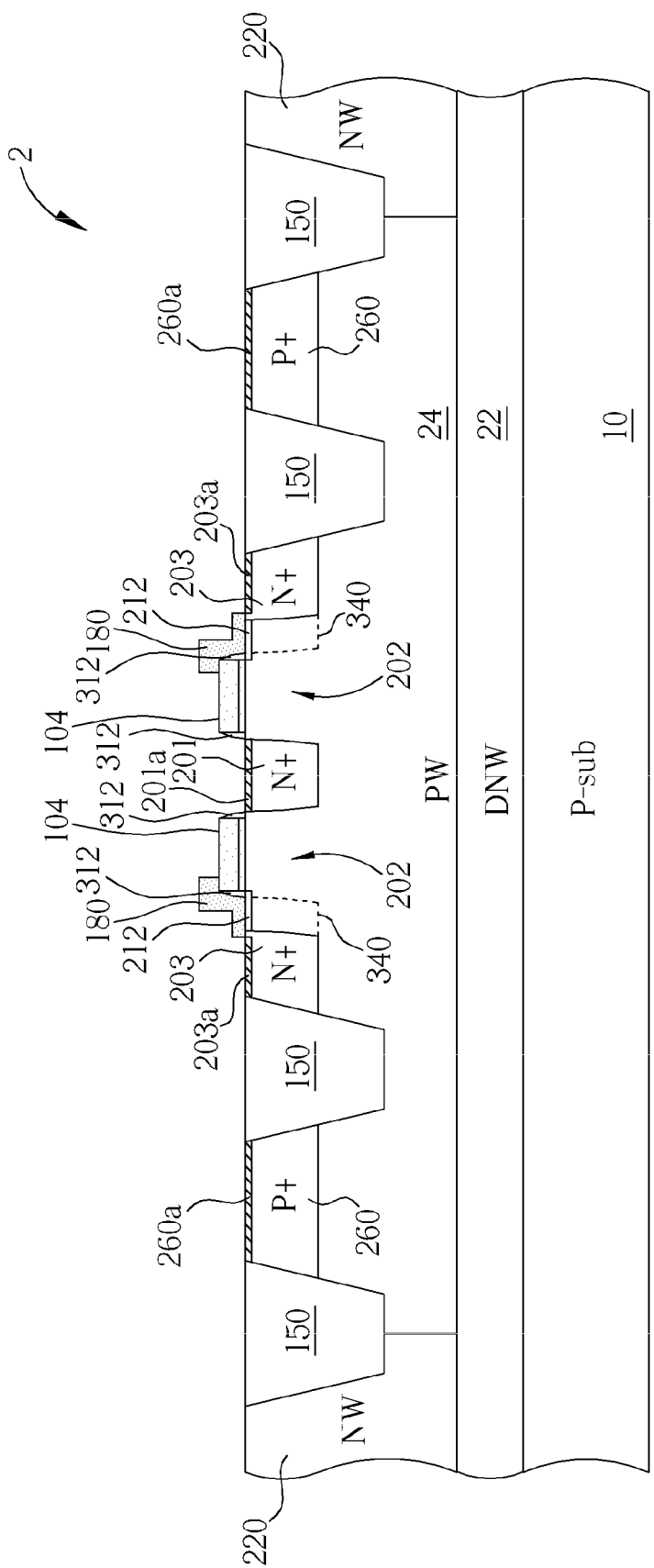
FIG. 3 is a schematic, cross-sectional view of a lateral NPN bipolar junction transistor in accordance with another embodiment of this invention.
Figure 4:
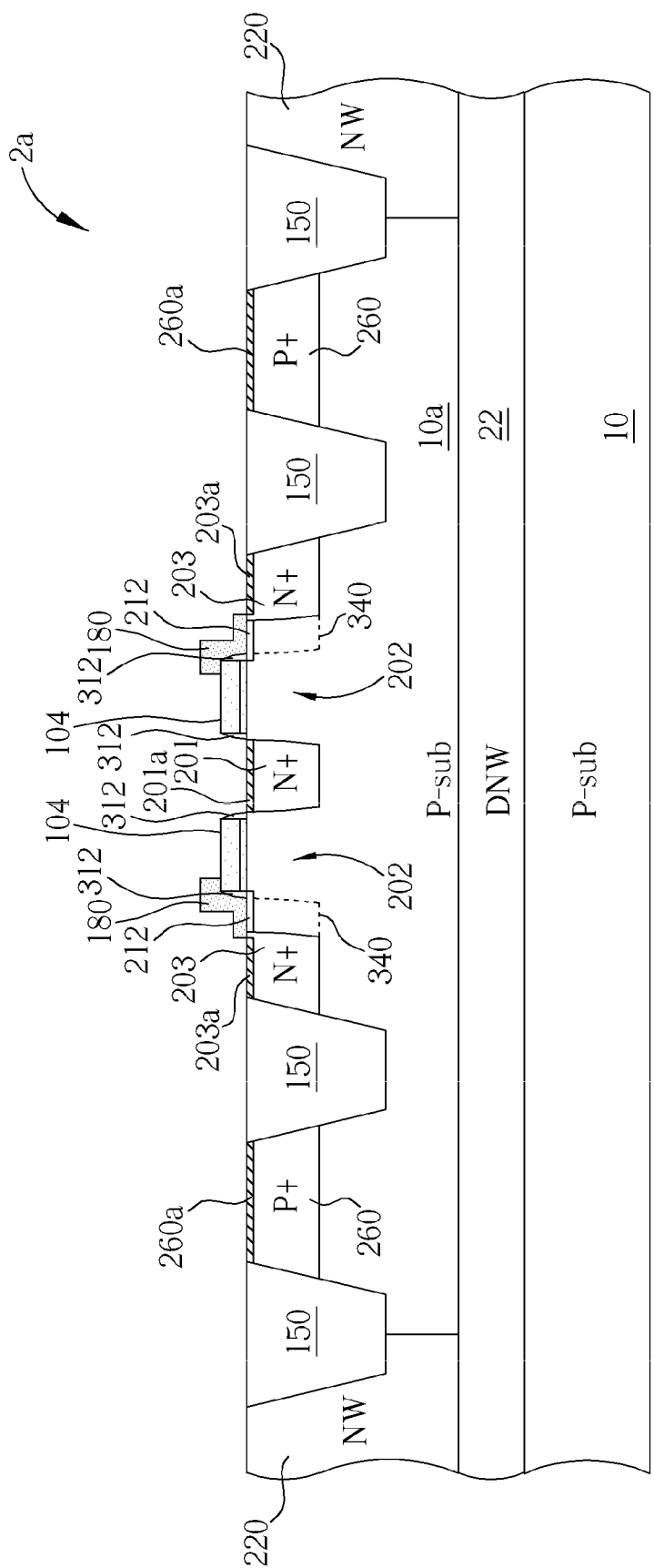
FIG. 4 is a schematic, cross-sectional view of a lateral NPN bipolar junction transistor in accordance with yet another embodiment of this invention.

FIG. 3 is a schematic, cross-sectional view of a lateral NPN bipolar junction transistor in accordance with another embodiment of this invention. As shown in FIG. 3, the lateral NPN bipolar transistor 2 may be formed in a semiconductor substrate 10 such as a P type doped silicon substrate. The lateral NPN bipolar transistor 2 comprises an $N^+$ doped region 201 that functions as an emitter region of the lateral NPN bipolar transistor 2. The $N^+$ doped region 201 may be formed within a P well (PW) 24. An annular N well 220 and a deep N well 22 under the P well 24 could be formed to isolate the P well 24. In another embodiment, the P well 24 may be omitted, as shown in FIG. 4, the annular N well 220 and the deep N well 22 could be formed to isolate a P substrate body 10a, and the lateral NPN bipolar transistor 2a could be fabricated in the P substrate body 10a.

A base region 202 underlying an annular polysilicon gate 104 may be disposed about a periphery of the emitter region 201. An annular $N^+$ doped region 203 that functions as a collector region of the lateral NPN bipolar transistor 2 may be formed within the P well 24 and disposed about a periphery of the base region 202. A shallow trench isolation (STI) region 150 may be disposed about a periphery of the collector region 203. An annular $P^+$ base contact 260 may be disposed about a periphery of the STI region 150. The collector region 203 may be pulled away from the edge of the spacer 312 of the polysilicon gate 104 in order to obtain a higher $BV_{CEO}$. To form such pull back collector region, a source/drain block layer could be employed to mask a portion of the active area or oxide defined (OD) area adjacent to the polysilicon gate 104 during the source/drain ion implant.

An N type lightly doped drain (NLDD) 212 may be situated between the collector region 203 and the polysilicon gate 104. The NLDD 212 may be disposed only on the side of the polysilicon gate 104 that is adjacent to the collector region 203, while on the other side adjacent to the emitter region 201, LDD may not be provided. In one aspect, the single sided NLDD 212 may be deemed a collector extension. The NLDD 212 could be formed simultaneously with the formation of LDD regions in CMOS devices. To form the single sided NLDD 212, a LDD block layer may be introduced into the fabrication process of the lateral NPN bipolar transistor 2. Further, a threshold voltage (Vt) implant block layer may be introduced into the fabrication process of the lateral NPN bipolar transistor 2 in order to create a lower doped base. The NLDD 212 may have a same doping concentration as a doping concentration of an I/O device, a doping concentration of a core device, or a sum thereof.

An annular salicide block (SAB) layer 180 may be formed on or over the NLDD 212 and disposed about a periphery of the polysilicon gate 104. The SAB layer 180 may extend up to the polysilicon gate 104. According to the embodiments of this invention, the SAB layer 180 may be composed of a dielectric material such as silicon oxide or silicon nitride. The SAB layer 180 also protects the NLDD 212, particularly the portion of the NLDD 212 between the edge of the collector region 203 and the edge of the spacer 312, from spike damage during the salicide process. After the formation of the SAB layer 180, an emitter salicide 201a may be formed on the emitter region 201. A collector salicide 203a may be formed on at least a portion of the collector region 203. A base salicide 260a may be formed on the P$^+$ base contact 260.

Figure 5:
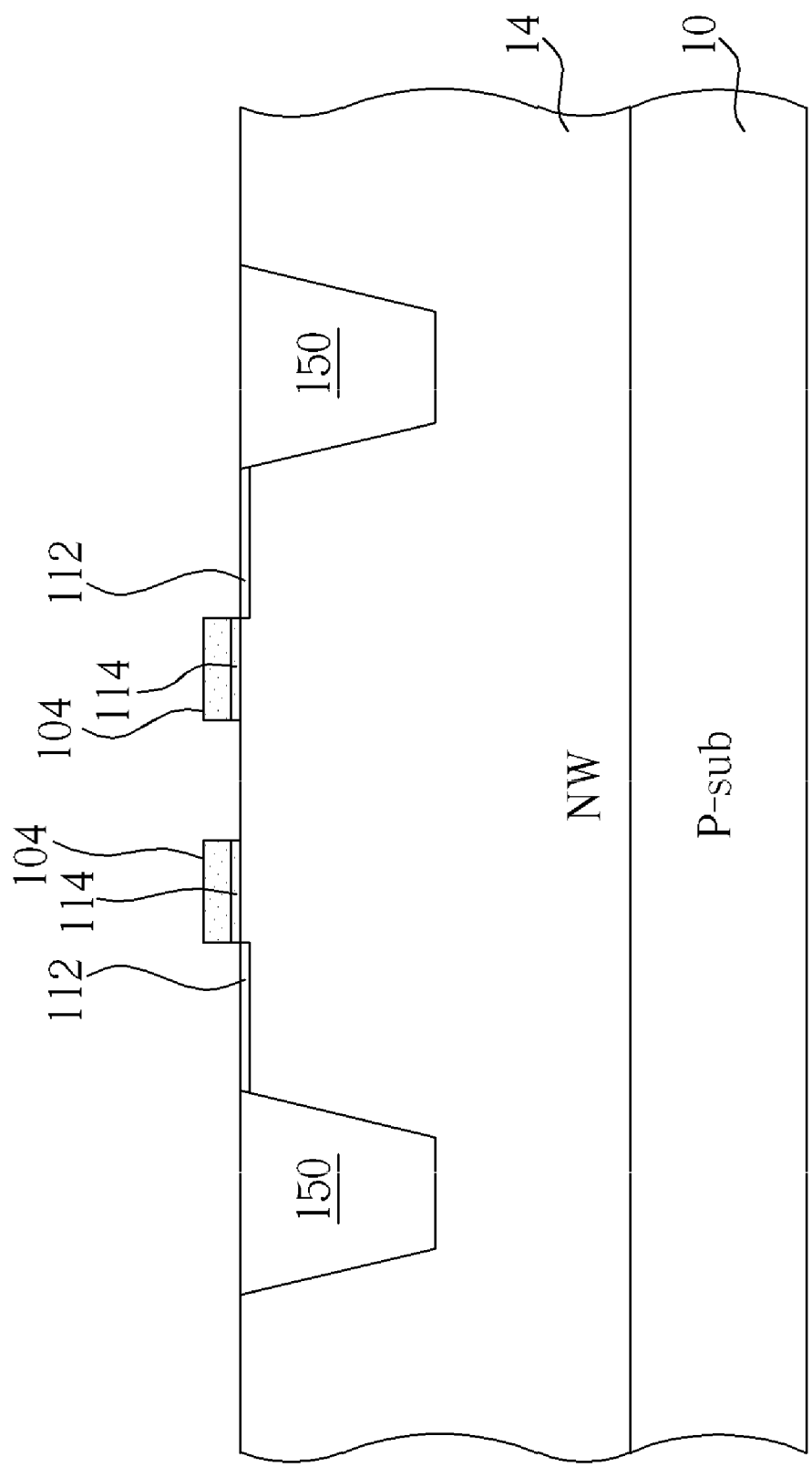
FIG. 5 to FIG. 10 are schematic, cross-sectional diagrams illustrating an exemplary process for fabricating the lateral PNP bipolar junction transistor of FIG. 1.

FIG. 5 to FIG. 10 are schematic, cross-sectional diagrams illustrating an exemplary process for fabricating the lateral PNP bipolar junction transistor 1 of FIG. 1. As shown in FIG. 5, a semiconductor substrate 10 such as a P type doped silicon substrate could be provided. An STI region 150 may be formed in the semiconductor substrate 10 to define an active area. Subsequently, an implantation process may be carried out to implant N type dopants into the semiconductor substrate 10 in order to form an N well 14 in the semiconductor substrate 10. On the main surface of the semiconductor substrate 10, an annular polysilicon gate 104 and gate dielectric layer 114 could be formed.

A PLDD 112 may be formed only on the side of the polysilicon gate 104 that is adjacent to the STI region 150, while on the other side, LDD may not be provided. The single sided PLDD 112 may be deemed a collector extension. In one embodiment, the PLDD 112 is formed simultaneously with the formation of LDD regions in CMOS devices. To form the single sided PLDD 112, an LDD block layer may be introduced into the fabrication process of the lateral PNP bipolar transistor. Further, a threshold voltage (Vt) implant block layer may be introduced into the fabrication process of the lateral PNP bipolar transistor 1 in order to create a lower doped base. The PLDD 112 may have a same doping concentration as a doping concentration of an I/O device, a doping concentration of a core device, or a sum thereof.

Figure 6:
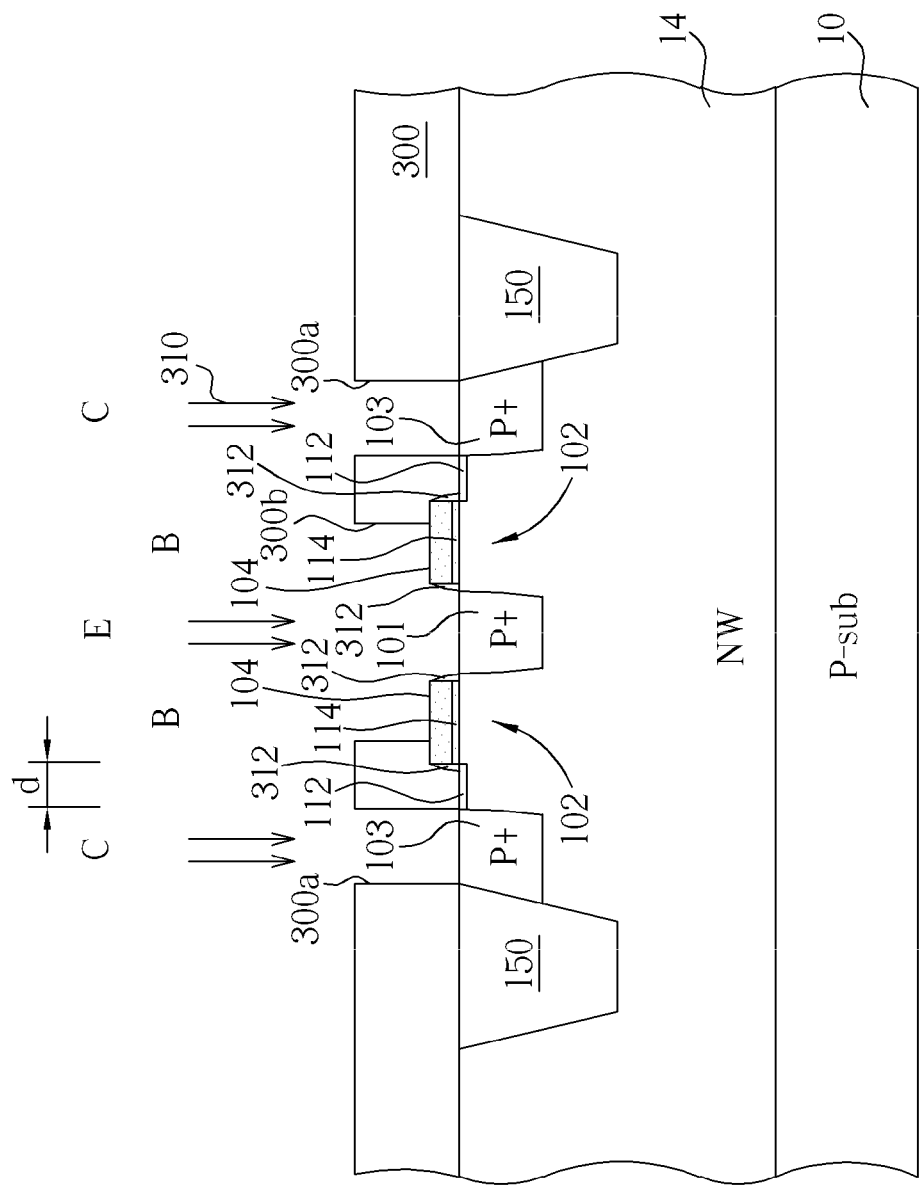

As shown in FIG. 6, after the formation of the single sided PLDD 112, a spacer 312 is formed on each sidewall of the gate 104. Thereafter, a photoresist pattern 300 may be formed on the semiconductor substrate 10. The photoresist pattern 300 may comprise an annular opening 300a and a central opening 300b. The photoresist pattern 300 blocks at least a portion of the PLDD 112 adjacent to the polysilicon gate 104. An ion implantation process 310 may then be carried out to implant P type dopants into the semiconductor substrate 10 through the annular opening 300a and the central opening 300b, thereby forming P$^+$ doped regions 101 and 103. After the ion implantation process 310 is completed, the photoresist pattern 300 may be removed. An offset d is between an edge of the spacer 312 of the gate 104 and the collector region 103.

Figure 7:
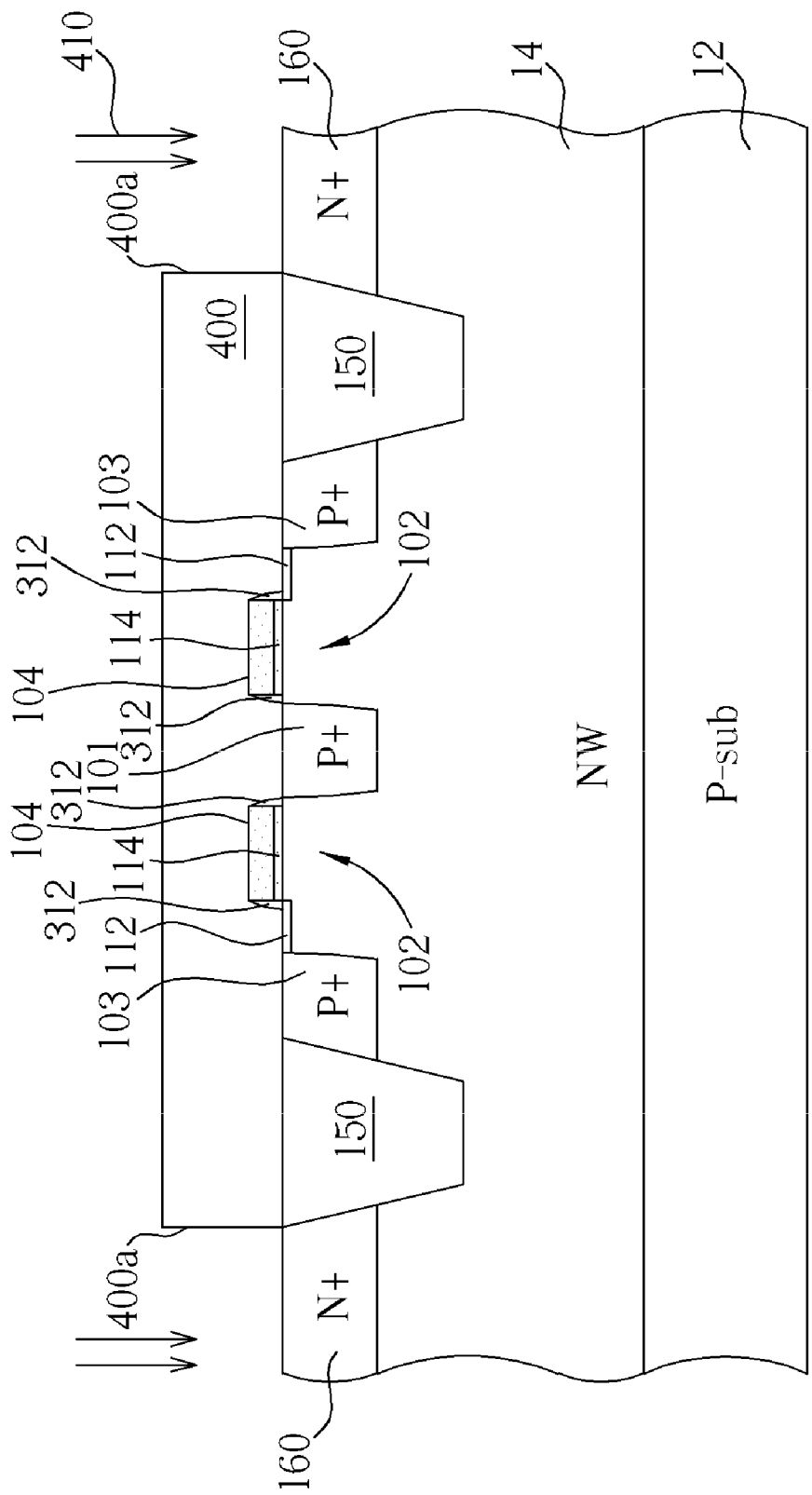

As shown in FIG. 7, a photoresist pattern 400 may be formed on the semiconductor substrate 10. The photoresist pattern 400 may comprise an annular opening 400a exposing an annular region of the semiconductor substrate 10 along the outskirt of the STI region 150. An ion implantation process 410 may then be carried out to implant N type dopants into the semiconductor substrate 10 through the annular opening 400a, thereby forming annular N$^+$ doped region 160 that acts as a base contact. After the ion implantation process 410 is completed, the photoresist pattern 400 may be removed.

Figure 8:
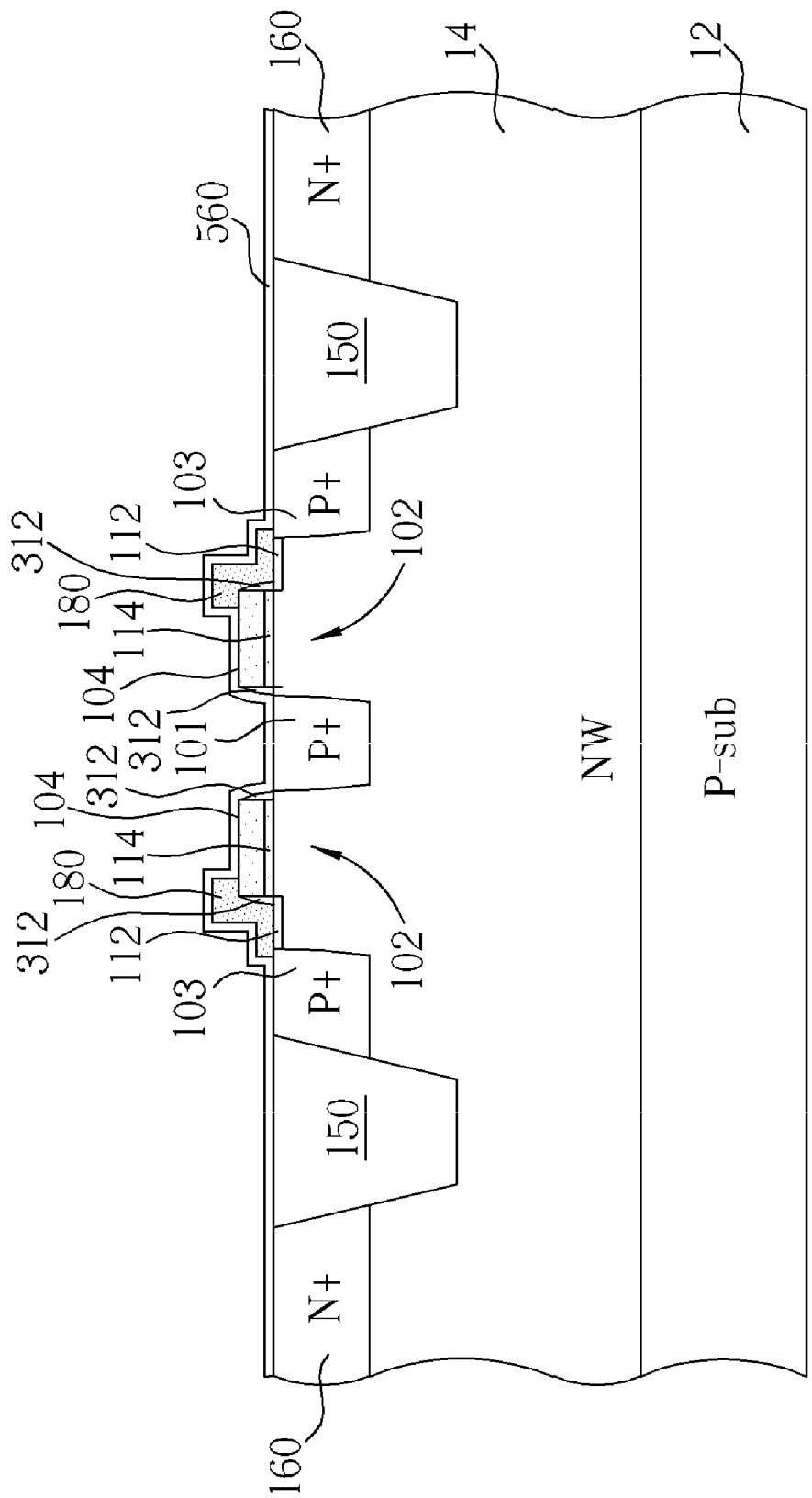
Figure 9:
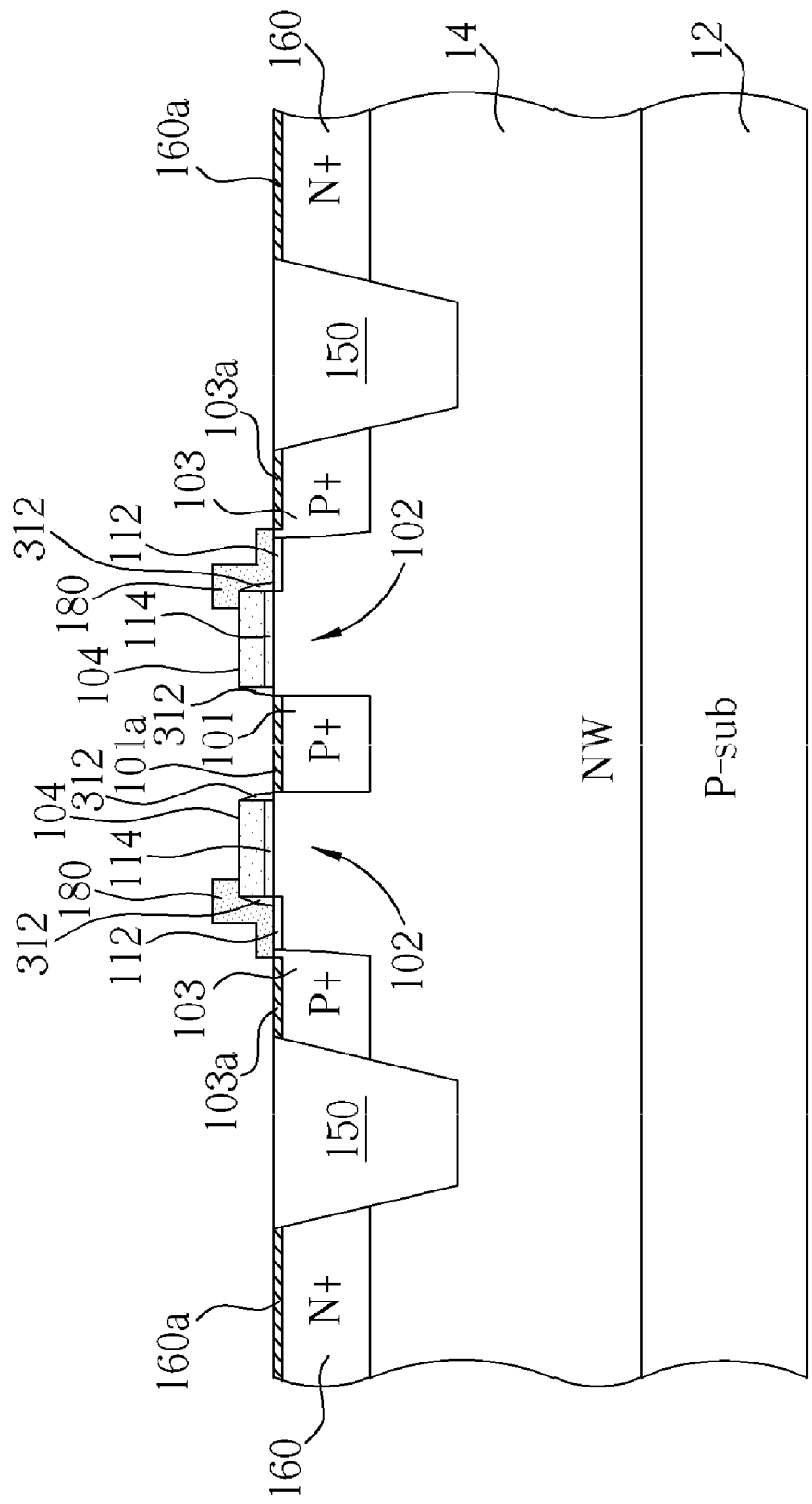
Figure 10:
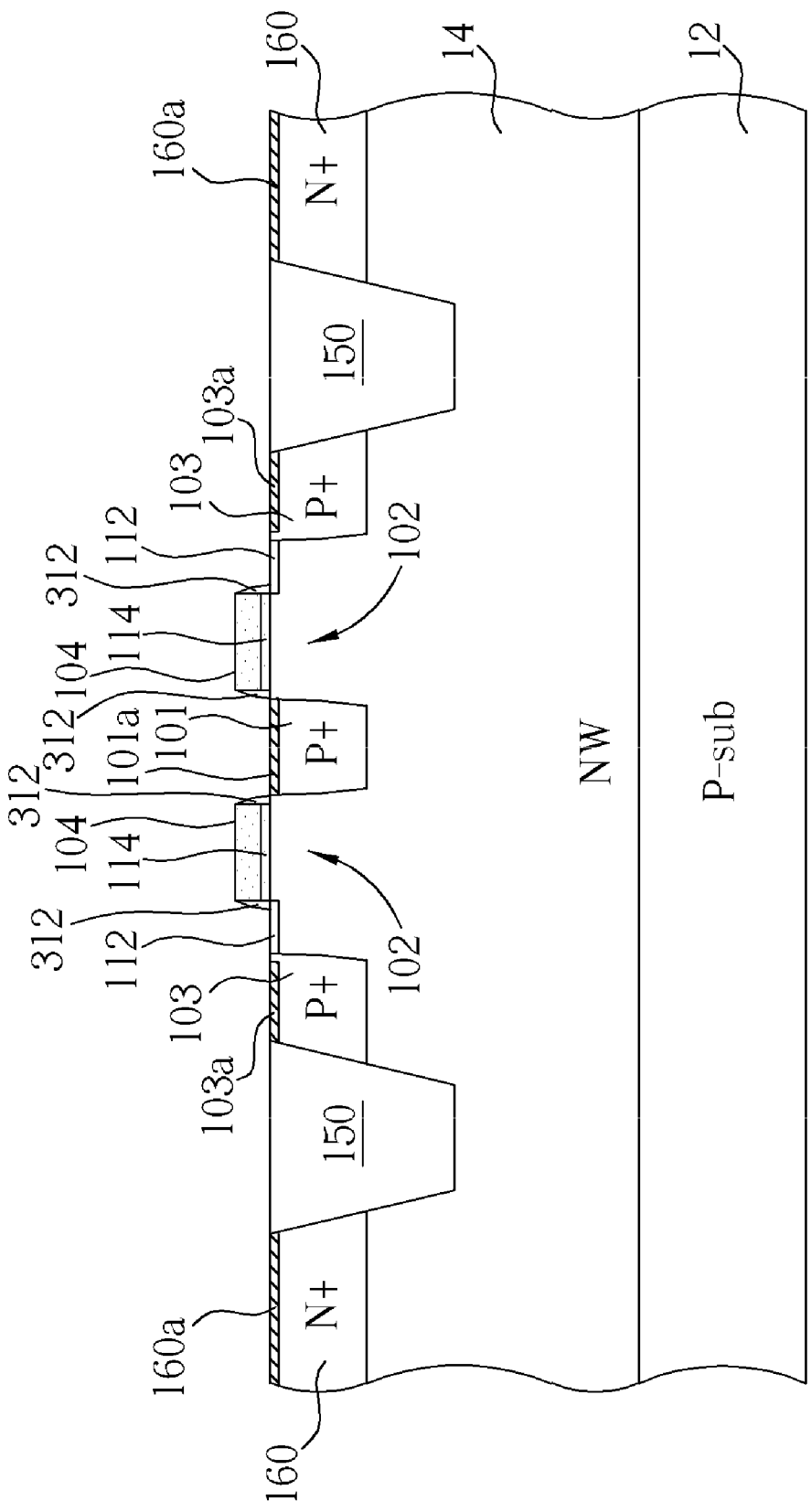

As shown in FIG. 8 and FIG. 9, a salicide process is performed. First, an annular salicide block (SAB) layer 180 may be formed on or over the PLDD 112 to block at least a portion of the LDD region and could be disposed about the polysilicon gate 104. The SAB layer 180 may extend up to the polysilicon gate 104. The SAB layer 180 may be composed of a dielectric material such as silicon oxide or silicon nitride. After the formation of the SAB layer 180, a metal layer 560 may be deposited on the semiconductor substrate 10 and an emitter salicide 101a may be formed on the emitter region 101, a collector salicide 103a may be formed on at least a portion of the collector region 103, and a base salicide 160a may be formed on the N$^+$ base contact 160. Optionally, the SAB layer 180 may be removed, as shown in FIG. 10.

Figure 12:
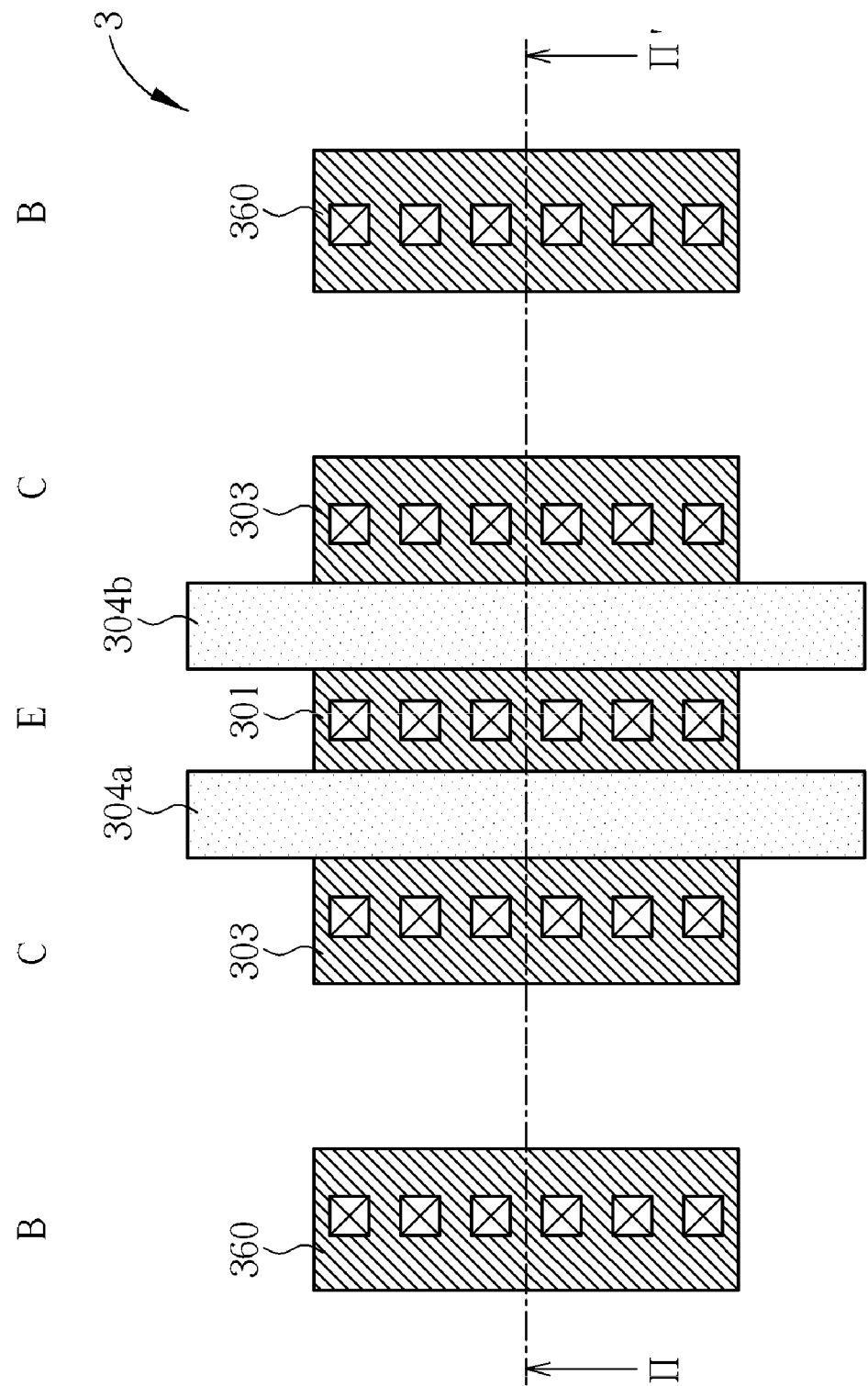
FIG. 12 and FIG. 13 demonstrate top plan views of the variants in accordance with other embodiments of this invention.
Figure 13:
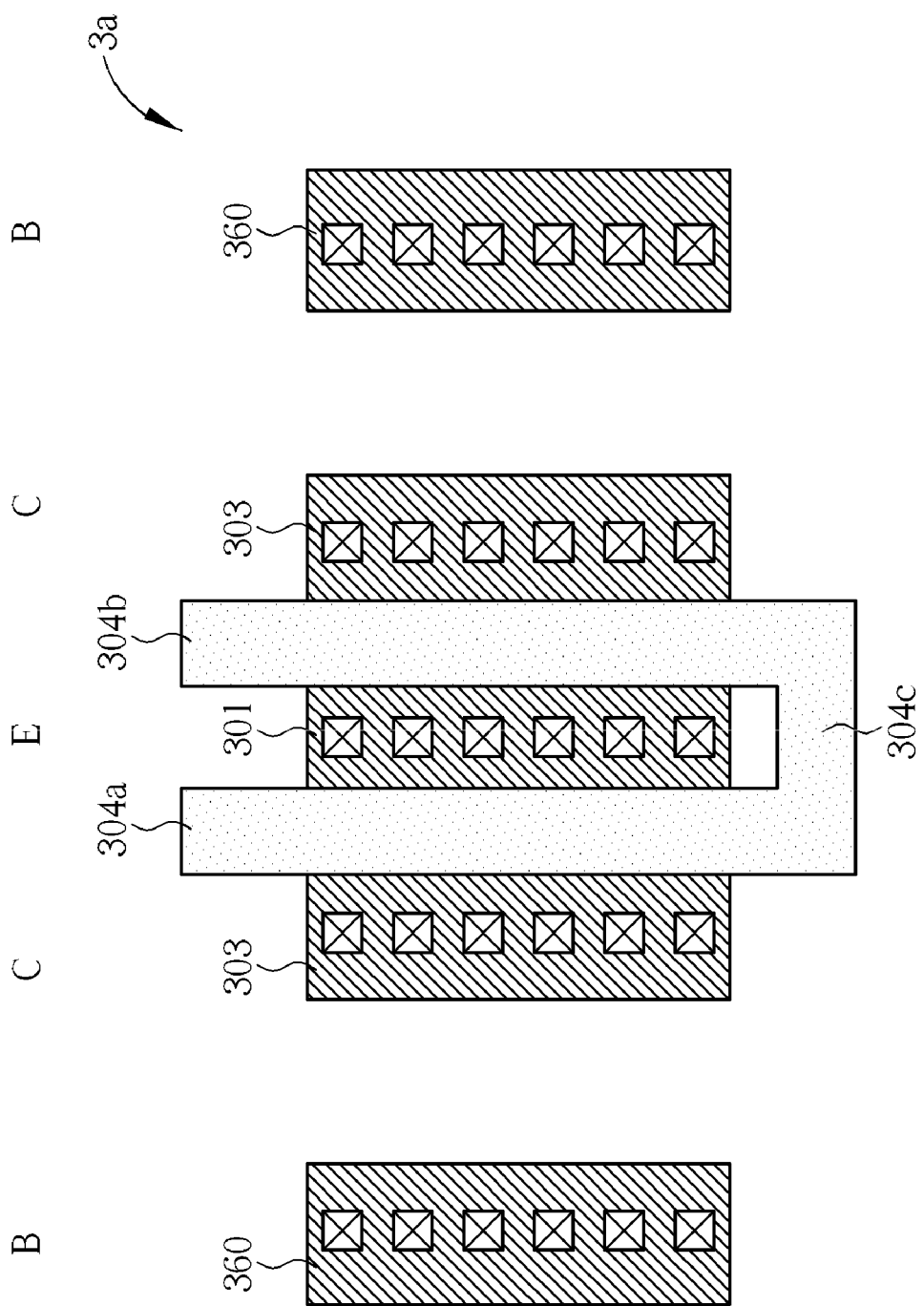

FIG. 12 and FIG. 13 demonstrate top plan views of the variants in accordance with other embodiments of this invention. As shown in FIG. 12, instead of the rectangular, annular-shaped polysilicon gate 104 as depicted in FIG. 1, two line-shaped polysilicon gate fingers 304a and 304b are used in the lateral bipolar transistor 3. The two polysilicon gate fingers 304a and 304b may be arranged in parallel to each other. For controlling the two parallel polysilicon gate fingers 304a and 304b, the polysilicon gate fingers 304a and 304b may be connected with each other by a poly bar 304c, thereby forming the U-shaped polysilicon gate as shown in FIG. 13. It is noteworthy that the poly bar 304c may be disposed outside the active area and may be on the isolation region, thus there may not be channel formed underneath the poly bar 304c. Alternatively, the polysilicon gate fingers 304a and 304b may be connected with each other by a metal line.

Figure 14:
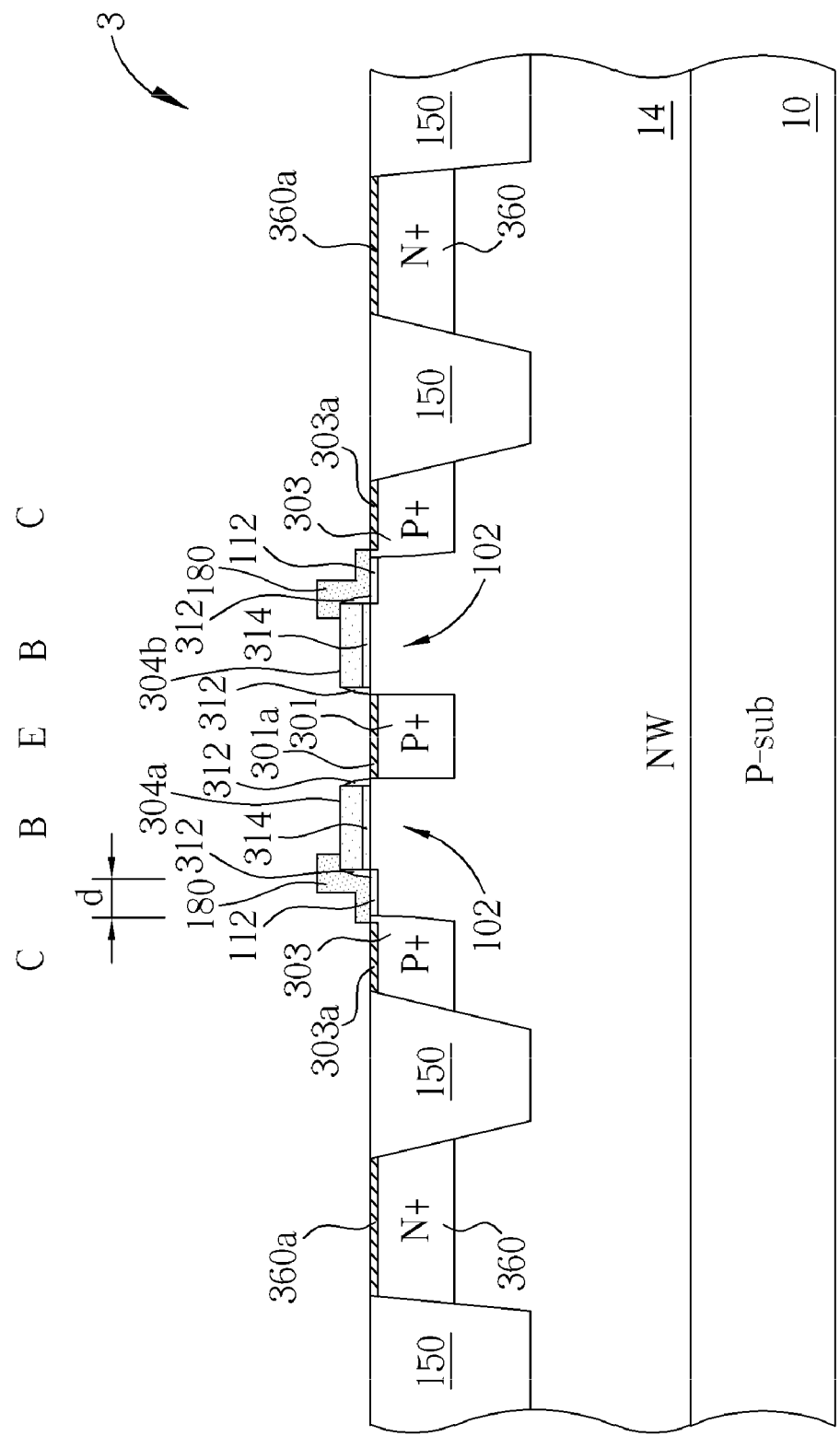
FIG. 14 is a schematic, cross-sectional diagram of the lateral bipolar transistor in FIG. 12 taken along line II-II'.

Referring now to FIG. 12 and FIG. 14 wherein FIG. 14 is a schematic, cross-sectional diagram of the lateral bipolar transistor 3 in FIG. 12 taken along line II-II', wherein like numeral numbers designate like regions, layers or elements. As shown in FIG. 12 and FIG. 14, a lateral PNP bipolar transistor 3 is formed in a semiconductor substrate 10 such as a P type doped silicon substrate. The lateral PNP bipolar transistor 3 comprises a P$^+$ doped region 301 that functions as an emitter region of the lateral PNP bipolar transistor 3, which is formed within an N well (NW) 14.

As can be seen in FIG. 12, the P$^+$ doped region 301 is formed between the polysilicon gate fingers 304a and 304b and has four sides. In this embodiment, two opposite sides thereof may be substantially contiguous with corresponding sides of the polysilicon gate fingers 304a and 304b. The other two sides of the P$^+$ doped region 301 may be substantially contiguous with the trench isolation region.

A base region 102 is defined underlying each of the polysilicon gate fingers 304a and 304b. A P$^+$ doped region 303 that functions as a collector region of the lateral PNP bipolar transistor 3 is formed within the N well 14 and is disposed at one side of the gate fingers 304a and 304b that is opposite to the P$^+$ doped region 301. A shallow trench isolation (STI) region 150 is provided in the N well 14 to isolate the P$^+$ doped region 303 from an N$^+$ base contact 360.

In this embodiment, the N well 14, the emitter region 301, the collector region 303, the STI region 150, the N+ base contact 360 and the polysilicon gate fingers 304a and 304b are formed simultaneously with the formation of respective diffusion regions and gate structures of CMOS devices. The polysilicon gate fingers 304a and 304b serve as an implant blockout mask during the formation of the emitter region 301 and the collector region 303.

As best seen in FIG. 14, a gate dielectric layer 314 is provided between each of the polysilicon gate fingers 304a and 304b and the base region 102. In one embodiment, the gate dielectric layer 314 is formed simultaneously with the formation of gate oxide layer in CMOS devices for input/output (I/O) circuits. Accordingly, the gate dielectric layer 314 underlying each of the polysilicon gate fingers 304a and 304b of the lateral PNP bipolar transistor 3 may have a thickness that is substantially equal to that of the gate oxide layer in CMOS devices for I/O circuits. By doing this, gate current (Ig) and GIDL (gate induced drain leakage) can be both reduced. On the two opposite sidewalls of each of the polysilicon gate fingers 304a and 304b, spacers 312 may be provided.

It is one germane feature of the present invention that the collector region 303 may be pulled away from the edge of the spacer 312 of each of the polysilicon gate fingers 304a and 304b in order to obtain a higher $BV_{CEO}$. To form such pull back collector region, a source/drain block layer may be employed to mask a portion of the active area or oxide defined (OD) area adjacent to the each of the polysilicon gate fingers 304a and 304b during the source/drain ion implant. The edge of the collector region 303 is kept at a distance from the edge of the spacer 312 on the sidewall of the each of the polysilicon gate fingers 304a and 304b. In one aspect, the so-called "pull back" in this specification means that the distance between the edge of the collector region 303 and the edge of the spacer 312 is greater than the distance between the edge of the emitter region 301 and the edge of the spacer 312 near the emitter region 301.

It is another feature of the present invention that a P type lightly doped drain (PLDD) 112 may be situated between the collector region 303 and each of the polysilicon gate fingers 304a and 304b. The PLDD 112 may be disposed only on the side of the each of the polysilicon gate fingers 304a and 304b that is adjacent to the collector region 303, while on the other side adjacent to the emitter region 301, LDD may not be provided. In one aspect, the single sided PLDD 112 may be deemed a collector extension. In one embodiment, the PLDD 112 at collector side is formed simultaneously with the formation of LDD regions in CMOS devices, for example, concurrently with the implant processes of input/output (I/O) LDD, core LDD or combination thereof, thus having substantially the same doping concentration as that of the I/O LDD or core LDD or a sum thereof. To form the single sided PLDD 112, a LDD block layer may be introduced into the fabrication process of the lateral PNP bipolar transistor 1. Likewise, a threshold voltage (Vt) implant block layer may be introduced into the fabrication process of the lateral PNP bipolar transistor 3 in order to create a lower doped base.

A salicide block (SAB) layer 180 may be formed on or over the PLDD 112 and may extend up to each of the polysilicon gate fingers 304a and 304b from the collector side. The SAB layer 180 may be composed of a dielectric material such as silicon oxide or silicon nitride. The SAB layer 180 also protects the PLDD 112, particularly the portion of the PLDD 112 between the edge of the collector region 303 and the edge of the spacer 312, from spike damage during the salicide process. After the formation of the SAB layer 180, an emitter salicide 301a may be formed on the emitter region 101. A collector salicide 303a may be formed on at least a portion of the collector region 303. A base salicide 360a may be formed on the N+ base contact 360. In one embodiment, the offset d between the collector salicide 303a and the edge of the spacer 312 of each of the polysilicon gate fingers 304a and 304b is not less than 0.1 μm.

The salicides 301a, 303a and 360a may be formed by depositing a metal over the substrate 10. Such metal reacts with the semiconductor material of the exposed regions to form the salicides, which provides low resistance contact to the emitter, the base and the collector of the lateral PNP bipolar transistor 3. The SAB layer 180 at the collector region 303, or say on or over the PLDD 112, prevents formation of salicide on or over the PLDD 112 or at the edge of each of the polysilicon gate fingers 304a and 304b. By providing the SAB layer 180 in the lateral PNP bipolar transistor 3, the leakage current due to salicide spike in the PLDD 112 can be avoided. The SAB layer 180 can be removed.

As can be seen in FIG. 12, since there may only be two opposite sides of the emitter region 301 are substantially contiguous with corresponding sides of the polysilicon gate fingers 304a and 304b, the lateral bipolar transistor 3 thus has higher beta and higher cut-off frequency (Ft).

Figure 15:
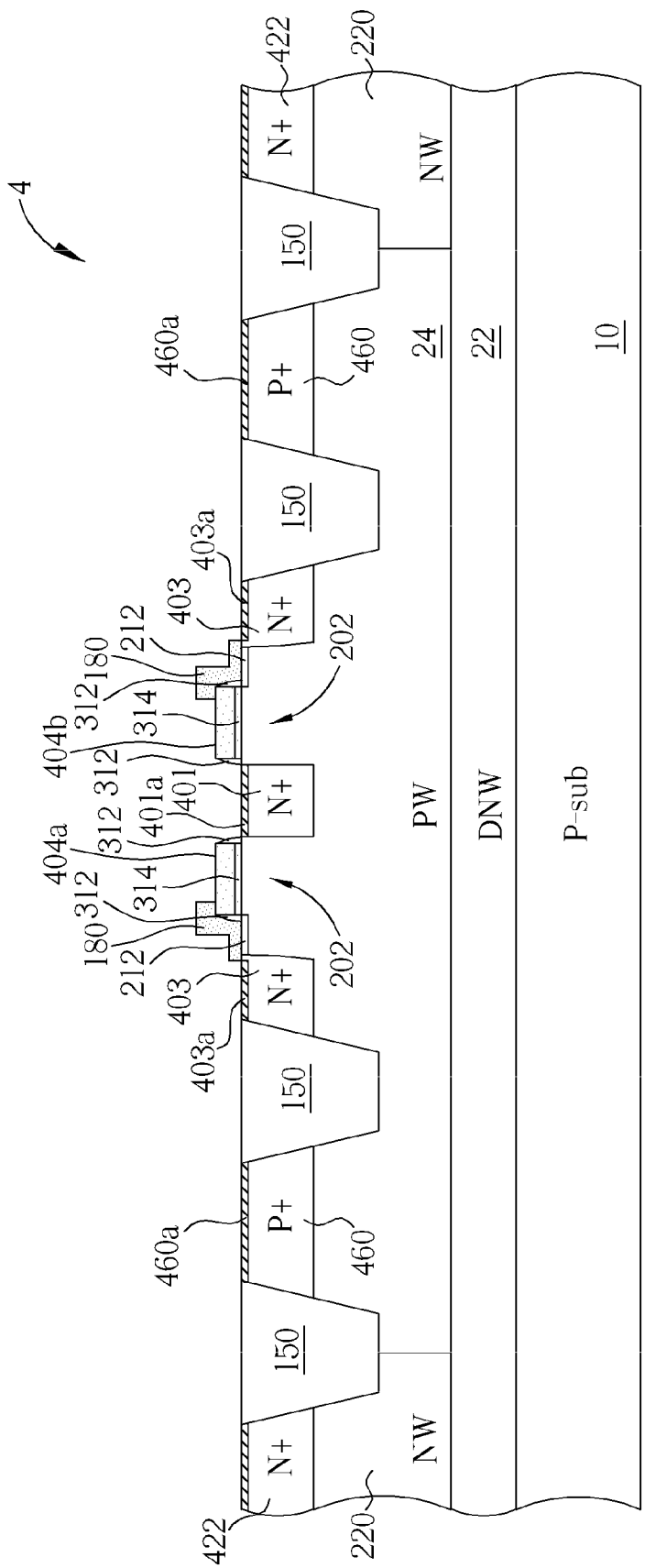
FIG. 15 is a schematic, cross-sectional view of a lateral NPN bipolar junction transistor in accordance with yet another embodiment of this invention.

It is understood that by reversing the polarity of the conductive dopants, a lateral NPN bipolar transistor can be made. FIG. 15 is a schematic, cross-sectional view of a lateral NPN bipolar junction transistor 4 having similar layout as set forth in FIG. 12 according to still another embodiment of this invention, wherein like numeral numbers designate like regions, layers or elements. As shown in FIG. 15, the lateral NPN bipolar transistor 4 may be formed in a semiconductor substrate 10 such as a P type doped silicon substrate. The lateral NPN bipolar transistor 4 comprises an N+ doped region 401 that functions as an emitter region of the lateral NPN bipolar transistor 4. The N+ doped region 401 may be formed within a P well (PW) 24. An N well 220 and a deep N well 22 under the P well 24 could be formed to isolate the P well 24. In another embodiment, the P well 24 may be omitted and the N well 220 and the deep N well 22 could be formed to isolate a P substrate body, and the lateral NPN bipolar transistor could be fabricated in the P substrate body. An N+ region 422 may be provided in the N well 220 as a pick up region.

A base region 202 underlying each of the polysilicon gate fingers 404a and 404b may be provided in the P well 24. An N+ doped region 403 that functions as a collector region of the lateral NPN bipolar transistor 4 may be formed within the P well 24. A shallow trench isolation (STI) region 150 may be disposed along the periphery of the collector region 403. A P+ base contact 460 may be disposed along the periphery of the STI region 150. The collector region 403 may be pulled away from the edge of the spacer 312 of each of the polysilicon gate fingers 404a and 404b in order to obtain a higher $BV_{CEO}$. To form such pull back collector region, a source/drain block layer could be employed to mask a portion of the active area or oxide defined (OD) area adjacent to each of the polysilicon gate fingers 404a and 404b during the source/drain ion implant.

An N type lightly doped drain (NLDD) 212 may be situated between the collector region 403 and each of the polysilicon gate fingers 404a and 404b. The NLDD 212 may be disposed only on the side of each of the polysilicon gate fingers 404a and 404b that is adjacent to the collector region 403, while on the other side adjacent to the emitter region 401, LDD may not be provided. In one aspect, the single sided NLDD 212 may be deemed a collector extension. The NLDD 212 could be formed simultaneously with the formation of LDD regions in CMOS devices, for example, concurrently with the implant processes of input/output (I/O) LDD, core LDD or combination thereof, thus having substantially the same doping concentration as that of the I/O LDD or core LDD or a sum thereof. To form the single sided NLDD 212, a LDD block layer may be introduced into the fabrication process of the lateral NPN bipolar transistor 4. Further, a threshold voltage (Vt) implant block layer may be introduced into the fabrication process of the lateral NPN bipolar transistor 4 in order to create a lower doped base.

A salicide block (SAB) layer 180 may be formed on or over the NLDD 212 and may extend up to each of the polysilicon gate fingers 404a and 404b from the collector side. According to the embodiments of this invention, the SAB layer 180 may be composed of a dielectric material such as silicon oxide or silicon nitride. The SAB layer 180 also protects the NLDD 212, particularly the portion of the NLDD 212 between the edge of the collector region 403 and the edge of the spacer 312, from spike damage during the salicide process. After the formation of the SAB layer 180, an emitter salicide 401a may be formed on the emitter region 401. A collector salicide 403a may be formed on at least a portion of the collector region 403. A base salicide 460a may be formed on the P+ base contact 460.

The salicides 401a, 403a and 460a may be formed by depositing a metal over the substrate 10. Such metal reacts with the semiconductor material of the exposed regions to form the salicides, which provides low resistance contact to the emitter, the base and the collector of the lateral NPN bipolar transistor 4. The SAB layer 180 at the collector region 403, or say on or over the NLDD 212, prevents formation of salicide on or over the NLDD 212 or at the edge of each of the polysilicon gate fingers 404a and 404b. By providing the SAB layer 180 in the lateral NPN bipolar transistor 4, the leakage current due to salicide spike in the NLDD 212 can be avoided. The SAB layer 180 can be removed.

Those skilled in the art will readily observe that numerous modifications and alterations of the device and method may be made while retaining the teachings of the invention.

What is claimed is:

1. A lateral bipolar junction transistor, comprising:
   an emitter region;
   a base region surrounding the emitter region;
   a gate disposed at least over a portion of the base region;
   a collector region surrounding the base region with an offset between an edge of a spacer of the gate and the collector region;
   a lightly doped drain region between the edge of the gate and the collector region;
   a salicide block layer disposed on or over the lightly doped drain region; and
   a collector salicide formed on at least a portion of the collector region.

2. The lateral bipolar junction transistor according to claim 1 wherein the emitter region has a polygonal shape.

3. The lateral bipolar junction transistor according to claim 1 wherein the lateral bipolar junction transistor is a lateral PNP bipolar transistor and wherein the emitter region is a P+ doped region formed in an N well.

4. The lateral bipolar junction transistor according to claim 1 wherein the lightly doped drain region is P type doped.

5. The lateral bipolar junction transistor according to claim 4 wherein no LDD is provided on a side of the gate adjacent to the emitter region.

6. The lateral bipolar junction transistor according to claim 1 wherein a shallow trench isolation region is disposed about the collector region.

7. The lateral bipolar junction transistor according to claim 6 further comprises a base contact region surrounding the shallow trench isolation region.

8. The lateral bipolar junction transistor according to claim 7 wherein the base contact region is an N+ doped region.

9. The lateral bipolar junction transistor according to claim 1 wherein a gate dielectric layer is provided between the gate and the base region.

10. The lateral bipolar junction transistor according to claim 9 wherein the gate dielectric layer is formed simultaneously with formation of gate oxide layer in CMOS devices for input/output (I/O) circuits.

11. The lateral bipolar junction transistor according to claim 1 wherein the lateral bipolar junction transistor is a lateral NPN bipolar transistor and wherein the emitter region is an N+ doped region formed in a P well.

12. The lateral bipolar junction transistor according to claim 11 wherein the P well is positioned on a deep N well.

13. The lateral bipolar junction transistor according to claim 1 wherein the lateral bipolar junction transistor is a lateral NPN bipolar transistor and wherein the emitter region is an N+ doped region formed in a P substrate.

14. A lateral bipolar junction transistor, comprising:
   an emitter region;
   a base region surrounding the emitter region;
   a gate disposed at least over a portion of the base region;
   a collector region surrounding the base region with an offset between an edge of a spacer of the gate and the collector region;
   a lightly doped drain region between the edge of the gate and the collector region; and
   a collector salicide formed on at least a portion of the collector region;
   wherein no salicide is formed on or over the lightly doped drain region.

15. A method for fabricating a lateral bipolar junction transistor, comprising:
   providing a substrate having thereon an annular gate, a trench isolation region disposed about the gate, and a lightly doped drain (LDD) region between the annular gate and the trench isolation region;
   ion implanting the substrate to form an emitter region surrounded by the annular gate and a collector region at one side of the annular gate opposite to the emitter region with an offset between an edge of a spacer of the gate and the collector region;
   ion implanting the substrate to form an annular base contact region about the trench isolation region;
   forming an annular salicide block (SAB) layer to block at least a portion of the LDD region; and
   forming a salicide layer on the emitter region and on the collector region that is not covered by the SAB layer.

16. The method according to claim 15 wherein the collector region surrounds a base region.

17. A lateral bipolar junction transistor, comprising:
   an emitter region;
   a first collector region spaced apart from the emitter region;
   a second collector region spaced apart from the emitter region and being disposed at one side of the emitter region opposite to the first collector region;
   a first gate finger between the first collector region and the emitter region;

a second gate finger between the second collector region and the emitter region, wherein the first and second gate fingers are in parallel with each other;

a base region under the first and second gate fingers;

a first lightly doped drain (LDD) region between the first gate finger and the first collector region;

a second LDD region between the second gate finger and the second collector region; and a collector salicide formed on at least a portion of the first and second collector regions;

wherein no salicide is formed on or over the first and second LDD regions.

18. The lateral bipolar junction transistor according to claim 17 wherein the first gate finger is electrically connected with the second gate finger.

19. The lateral bipolar junction transistor according to claim 18 wherein the first gate finger is electrically connected with the second gate finger through a poly bar.

20. The lateral bipolar junction transistor according to claim 18 wherein the first gate finger is electrically connected with the second gate finger through a metal line.

21. The lateral bipolar junction transistor according to claim 17 wherein the first LDD region has a same doping concentration as a doping concentration of an I/O device, a doping concentration of a core device, or a sum thereof.

22. The lateral bipolar junction transistor according to claim 17 wherein the second LDD region has a same doping concentration as a doping concentration of an I/O device, a doping concentration of a core device, or a sum thereof.

* * * * *